United States Patent
Ostrander et al.

(10) Patent No.: US 9,056,441 B2
(45) Date of Patent: Jun. 16, 2015

(54) EMBLEM ASSEMBLY AND METHOD OF FORMING SAME

(75) Inventors: Catherine A. Ostrander, Grand Blanc, MI (US); Joel Colombo, Howell, MI (US); Mary K. Gusie, Grand Blanc, MI (US); Kitty L. Gong, Macomb, MI (US); Charles K. Buehler, Lansing, MI (US); Michael P. Balogh, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 667 days.

(21) Appl. No.: 13/361,173

(22) Filed: Jan. 30, 2012

(65) Prior Publication Data

US 2013/0196089 A1 Aug. 1, 2013

(51) Int. Cl.
*B29C 65/00* (2006.01)
*B32B 37/00* (2006.01)
(Continued)

(52) U.S. Cl.
CPC ......... *B32B 15/00* (2013.01); *B32B 2038/0092* (2013.01); *B60R 13/00* (2013.01); *B60R 13/005* (2013.01)

(58) Field of Classification Search
CPC ........ B32B 27/00; B32B 27/06; B32B 27/08; B32B 2451/00; B32B 2605/006; B29C 65/00; B29C 65/48; B29C 66/1122; B60R 13/04; B60R 13/005; C23C 14/00; C23C 14/04; C23C 14/042; C23C 14/06; C23C 14/14; C23C 14/20; C23C 14/205; C23C 14/22; C23C 14/24
USPC ............... 156/60, 63, 71, 150, 151, 277, 278, 156/281, 293, 295, 297, 298, 303.1, 310; 428/31; 427/248.1, 250, 294, 296, 401, 427/402, 404
See application file for complete search history.

(56) References Cited

U.S. PATENT DOCUMENTS

| 4,076,789 A | 2/1978 | Geller et al. |
| 4,130,623 A | 12/1978 | Walter |

(Continued)

FOREIGN PATENT DOCUMENTS

| DE | 9321214 U1 | 9/1996 |
| DE | 102007041347 A1 | 3/2009 |

(Continued)

OTHER PUBLICATIONS

USPTO Office Action mailed on Nov. 7, 2011 for U.S. Appl. No. 12/892,030, filed Sep. 28, 2010.

(Continued)

*Primary Examiner* — Philip Tucker
*Assistant Examiner* — Brian R Slawski
(74) *Attorney, Agent, or Firm* — Quinn Law Group, PLLC (57) ABSTRACT

A method of forming an emblem assembly configured for attachment to a vehicle includes positioning a mask adjacent and in contact with a second element so that the mask covers only a selected portion of the second element and does not cover an exposed portion of the second element. The method includes vacuum metalizing a first coating onto only the exposed portion, wherein the first coating has a distal edge surface abutting the mask, and, after vacuum metalizing, removing the mask from the second element to uncover the selected portion. The method includes depositing a back coating onto only the first coating and the selected portion to thereby wrap the back coating around the distal edge surface, and, after depositing, inserting the second element into a first element configured for attachment to the vehicle so that the first coating does not contact the first element to form the assembly.

12 Claims, 6 Drawing Sheets

(51) Int. Cl.
  *B32B 38/00* (2006.01)
  *F02F 1/06* (2006.01)
  *B32B 7/00* (2006.01)
  *B60R 13/00* (2006.01)
  *C23C 16/00* (2006.01)
  *B05D 3/00* (2006.01)
  *B05D 1/36* (2006.01)
  *B05D 7/00* (2006.01)
  *B32B 15/00* (2006.01)

(56) References Cited

U.S. PATENT DOCUMENTS

| | | | |
|---|---|---|---|
| 4,556,588 | A | 12/1985 | Rockwood |
| 4,769,100 | A | 9/1988 | Short et al. |
| 4,824,506 | A | 4/1989 | Hoerner et al. |
| 4,828,637 | A | 5/1989 | Mentzer et al. |
| 4,838,973 | A | 6/1989 | Mentzer et al. |
| 4,868,030 | A | 9/1989 | Mentzer et al. |
| 4,957,802 | A | 9/1990 | Mentzer et al. |
| 4,960,558 | A | 10/1990 | Short |
| 4,976,896 | A | 12/1990 | Short et al. |
| 5,021,278 | A | 6/1991 | Short |
| 5,698,276 | A | 12/1997 | Mirabitur |
| 6,579,397 | B1 | 6/2003 | Spain et al. |
| 6,581,252 | B1* | 6/2003 | Sedlock et al. ............... 24/297 |
| 6,682,805 | B1 | 1/2004 | Lilly |
| 6,835,348 | B2 | 12/2004 | Hirosue et al. |
| 6,863,854 | B2 | 3/2005 | Lilly |
| 7,390,454 | B2 | 6/2008 | Ostrander et al. |
| 7,645,416 | B2 | 1/2010 | Buehler et al. |
| 2002/0032250 | A1 | 3/2002 | Okazaki et al. |
| 2003/0008134 | A1 | 1/2003 | Murar et al. |
| 2004/0125023 | A1* | 7/2004 | Fujii et al. ............. 343/700 MS |
| 2010/0028610 | A1* | 2/2010 | Fujii et al. ..................... 428/164 |

FOREIGN PATENT DOCUMENTS

| | | |
|---|---|---|
| EP | 0060721 A1 | 9/1982 |
| EP | 0942820 A1 | 9/1999 |
| WO | 9908870 A1 | 2/1999 |

OTHER PUBLICATIONS

USPTO Office Action mailed on Nov. 7, 2011 for U.S. Appl. No. 12/892,027, filed Sep. 28, 2010.
USPTO Office Action mailed on Nov. 7, 2011 for U.S. Appl. No. 12/890,798, filed Sep. 27, 2010.
U.S. Appl. No. 13/303,729, filed Nov. 23, 2011; Catherine A. Ostrander, Kitty L. Gong, Charles K. Buehler, Chris A. Oberlitner.
U.S. Appl. No. 13/343,763, filed Jan. 5, 2012; Catherine A. Ostrander, Kitty L. Gong, Charles K. Buehler, Chris A. Oberlitner.
U.S. Appl. No. 12/892,030, filed Sep. 28, 2010; Bruce N. Greve, Kitty L. Gong.
U.S. Appl. No. 12/892,027, filed Sep. 28, 2010; Bruce N. Greve.
U.S. Appl. No. 12/890,798, filed Sep. 27, 2010; Michael A. Szymberski.

* cited by examiner

EMBLEM ASSEMBLY AND METHOD OF FORMING SAME

TECHNICAL FIELD

The present disclosure generally relates to an emblem assembly configured for attachment to a vehicle and to a method of forming the emblem assembly.

BACKGROUND

Vehicles often include distinctive badging, such as emblems, to denote a brand and/or manufacturer of the vehicle. Such emblems are generally designed to convey a positive and easily-recognizable association between the vehicle and the manufacturer of the vehicle, and are therefore often attached to visible exterior surfaces of the vehicle, e.g., front grilles, rear liftgates and trunks, and/or wheel covers. Any defect or degradation of the emblem may diminish the perceived quality of the vehicle and/or tarnish the reputation of the vehicle manufacturer.

SUMMARY

A method of forming an emblem assembly configured for attachment to a vehicle includes positioning a mask adjacent and in contact with a second element so that the mask covers only a selected portion of the second element and does not cover an exposed portion of the second element. The method also includes vacuum metalizing a first coating onto only the exposed portion, wherein the first coating has a distal edge surface abutting the mask. After vacuum metalizing, the method includes removing the mask from th0 e second element to uncover the selected portion. The method further includes depositing a back coating onto only the first coating and the selected portion to thereby wrap the back coating around the distal edge surface. In addition, the method includes, after depositing, inserting the second element into a first element configured for attachment to the vehicle so that the first coating does not contact the first element to form the emblem assembly.

In one embodiment, the method includes disposing the second element within a cavity defined by a fixture. The second element has a third surface, a fourth surface spaced apart from the third surface, and a fifth surface interconnecting the third surface and the fourth surface, wherein the fifth surface abuts the third surface to form an edge. After disposing, the method includes positioning a mask adjacent and in contact with the second element along the fifth surface so that the mask covers only the selected portion of the second element and does not cover the exposed portion of the second element, wherein the fifth surface from the fourth surface to the edge is the selected portion, and the third surface is the exposed portion. The method further includes vacuum metalizing a first coating formed from aluminum onto the third surface, wherein the first coating is not disposed on the fifth surface. The first coating has a distal edge surface that is substantially flush with the fifth surface at the edge. After vacuum metalizing, the method includes removing the mask from the fifth surface to uncover the selected portion. After removing the mask, the method includes depositing a back coating onto the first coating and the fifth surface to thereby wrap the back coating around the distal edge surface. After depositing, the method includes inserting the second element into a first element configured for attachment to the vehicle to thereby form the emblem assembly. The first element has a first surface and a second surface recessed from the first surface, and includes a chrome plating disposed on the first surface and the second surface. The first coating does not contact the chrome plating disposed on the second surface.

An emblem assembly configured for attachment to a vehicle includes a first element configured for attachment to the vehicle. The first element has a first surface and a second surface recessed from the first surface. The first element also includes a chrome plating disposed on the first surface and the second surface. The emblem assembly further includes a second element configured for attachment to the first element. The second element has a third surface, a fourth surface spaced apart from the third surface, and a fifth surface interconnecting the third surface and the fourth surface, wherein the fifth surface abuts the third surface to form an edge. In addition, the emblem assembly includes a first coating formed from vacuum-metalized aluminum, wherein the first coating is disposed on the third surface and is not disposed on the fifth surface, and further wherein the first coating defines a distal edge surface that is substantially flush with the fifth surface at the edge. The emblem assembly also includes a back coating disposed on the first coating and the fifth surface to thereby wrap around the distal edge surface so that the first coating does not contact the chrome plating disposed on the second surface.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

DETAILED DESCRIPTION

Figure 1:
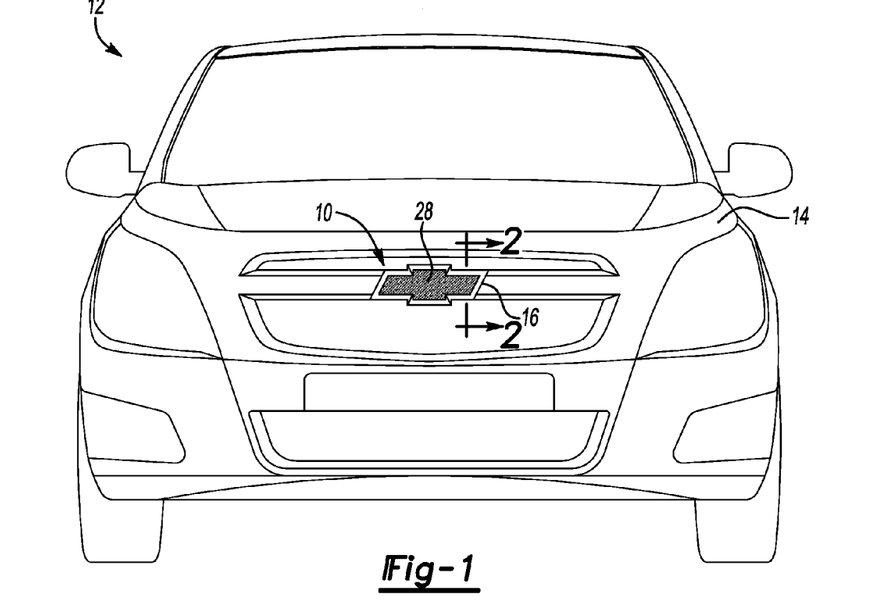
FIG. 1 is a schematic illustration of an elevational view of an emblem assembly attached to an exterior surface of a vehicle, wherein the emblem assembly includes a first element attachable to the vehicle and a second element attachable to the first element.

Referring to the Figures, wherein like reference numerals refer to like elements, an emblem assembly 10 configured for attachment to a vehicle 12 is shown generally in FIG. 1. For example, the emblem assembly 10 may be an emblem or badge configured for attachment to an automotive vehicle. In another example, although not shown, the emblem assembly 10 may be a body side molding or rocker useful for attachment to the exterior surface 14 of the automotive vehicle. However, the emblem assembly 10 may also be useful for non-automotive applications, such as, but not limited to, construction, rail, aviation, and marine vehicles.

Figure 2:
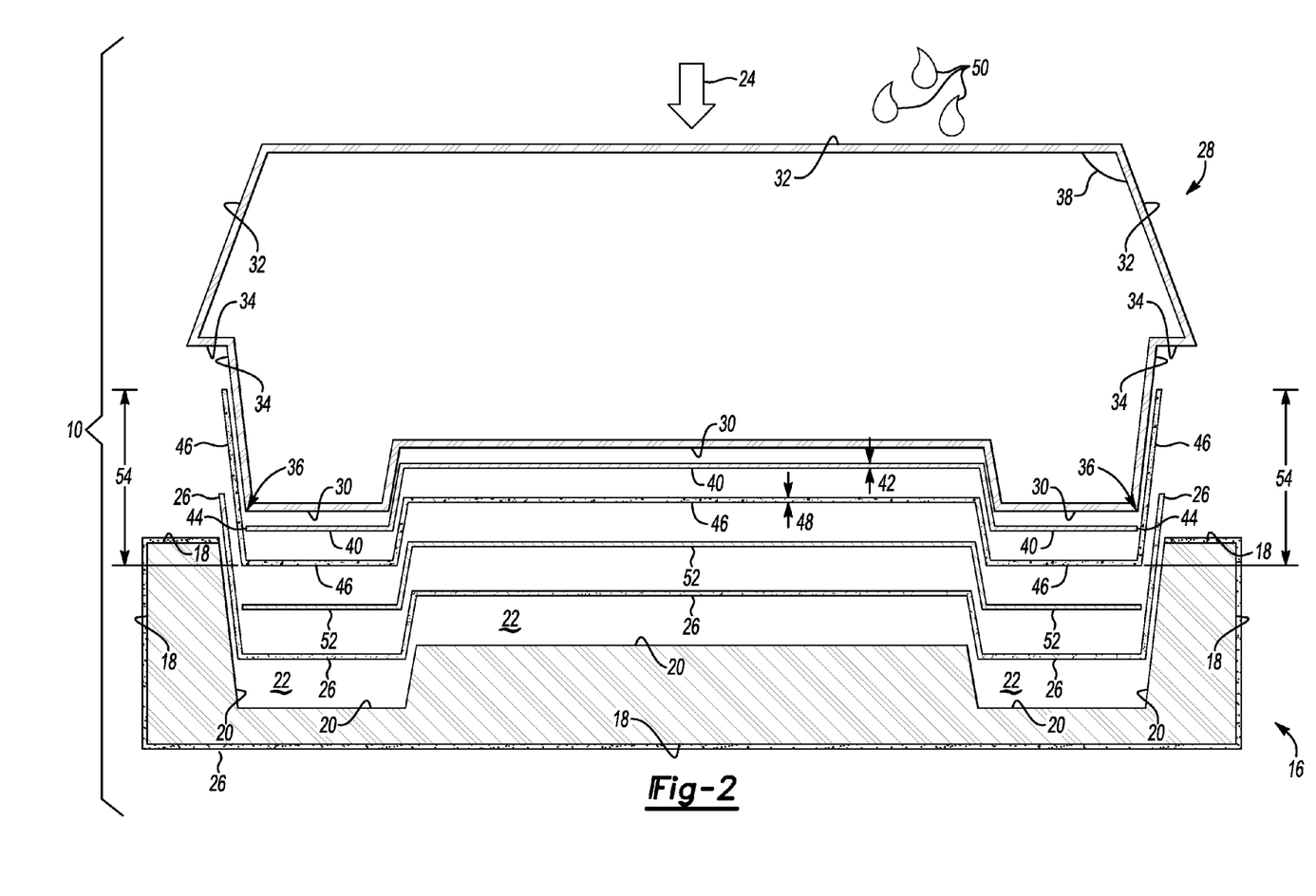
FIG. 2 is a schematic exploded cross-sectional illustration of the emblem assembly of FIG. 1 taken along section lines 2-2.

Referring now to FIG. 2, the emblem assembly 10 includes a first element 16 configured for attachment to the vehicle 12 (FIG. 1). For example, the first element 16 may be a carrier or bezel and may be configured for attachment to any location or component (not shown) of the vehicle 12, such as, but not limited to, a front grille, rear liftgate, trunk lid, wheel cover, side panel, trim panel, and/or steering wheel. The first element 16 may be attached to the vehicle 12 via any suitable method or attachment device, e.g., screws, tape, or a snap-fit. Therefore, the first element 16 may be formed from any suitable material and selected according to an expected operating environment of the vehicle 12. By way of non-limiting examples, the first element 16 may be formed from metal, plastic, and combinations thereof In one embodiment, the first element 16 may be formed from acrylonitrile butadiene styrene (ABS).

With continued reference to FIG. 2, the first element 16 has a first surface 18 and a second surface 20 recessed from the first surface 18. That is, the second surface 20 may extend from the first surface 18 and define a recession or cavity 22 within the first element 16. In one example shown in FIG. 2, the second surface 20 may be substantially U-shaped. During vehicle operation, a portion of the first surface 18 may be visible to an occupant or operator of the vehicle 12 when viewed from a direction of arrow 24. In contrast, the second surface 20 may be substantially hidden from view by another component of the emblem assembly 10, as set forth in more detail below.

In addition, the first element 16 includes a chrome plating 26 disposed on the first surface 18 and the second surface 20. That is, the first element 16 may be coated for aesthetics and/or protection. For example, the first element 16 may be formed from chrome-plated plastic, such as chrome-plated acrylonitrile butadiene styrene (ABS) as set forth above.

Referring again to FIG. 2, the emblem assembly 10 also includes a second element 28. The second element 28 is configured for attachment to the first element 16 and may be generally sized and shaped to fit within the cavity 22 defined by the second surface 20 of the first element 16. For example, the second element 28 may be a lens configured for attachment to the aforementioned bezel, i.e., the first element 16. Further, comparatively more of the second element 28 may be visible to an occupant or operator of the vehicle 12 (FIG. 1) than the first element 16 when viewed from the direction of arrow 24. Therefore, the second element 28 may have a shape easily-recognizable as associated with a specific vehicle brand and/or manufacturer. For example, the second element 28 may have a square shape, a bowtie shape, a pointed shape, and/or may include a circular crest shape or a combination of letters. In addition, the second element 28 may have a shape that is the same or different than the shape of the first element 16.

Referring again to FIG. 2, the second element 28 has a third surface 30 and a fourth surface 32 spaced apart from the third surface 30. In general, the third surface 30 may be hidden from view upon attachment of the emblem assembly 10 to the vehicle 12 (FIG. 1) when viewed from a direction of arrow 24. In contrast, the fourth surface 32 may be visible to an occupant or operator of the vehicle 12 upon attachment of the emblem assembly 10 to the vehicle 12 when viewed from the direction of arrow 24.

With continued reference to FIG. 2, the second element 28 also has a fifth surface 34 interconnecting the third surface 30 and the fourth surface 32, wherein the fifth surface 34 abuts the third surface 30 to form an edge 36. As such, the fifth surface 34 may also be substantially hidden from a vehicle occupant or operator when the first element 16 is attached to the second element 28.

As shown in FIG. 2, the fifth surface 34 and at least one of the third surface 30 and the fourth surface 32 may define an angle 38 therebetween of greater than 90°. That is, a portion of the second element 28 may be tapered. Alternatively, although not shown, the third surface 30 and the fourth surface 32 may each be substantially perpendicular to the fifth surface 34.

The second element 28 may be formed from any suitable material. For example, the second element 28 may be formed from plastic, such as, but not limited to, acrylic. In addition, the second element 28 may be translucent, and/or may be tinted to a specific color, e.g., gold or red. In one variation, the second element 28 may be transparent.

With continued reference to FIG. 2, the emblem assembly 10 also includes a first coating 40 formed from vacuum-metalized aluminum, wherein the first coating 40 is disposed on the third surface 30 and is not disposed on the fifth surface 34. The first coating 40 may be a layer capable of imparting enhanced aesthetics to the second element 28 and the emblem assembly 10. Therefore, in one example, the first coating 40 is formed from vacuum-metalized aluminum to impart a sheen or metallic appearance to the second element 28.

The first coating 40 may be deposited on the third surface 30 via any suitable process. More specifically, the first coating 40 may be deposited onto the third surface 30 via vacuum metallization. As used herein, the terminology "vacuum metallization" refers to a physical vapor deposition process capable of depositing a thin layer of aluminum, i.e., the first coating 40, onto a component, e.g., the second element 28. The first coating 40 may have a thickness 42 (FIG. 2) of from about 0.01 µm to about 0.2 µm. Further, the thickness 42 of the first coating 40 may not substantially vary along the third surface 30, and the first coating 40 may be disposed along the entire third surface 30.

Additionally, with continued reference to FIG. 2, for the variation including the transparent second element 28, the first coating 40 may be visible through the fourth surface 32 when viewed from the direction of arrow 24. Therefore, to maximize the perceived quality of the vehicle 12 (FIG. 1), the first coating 40 may be substantially free from degradation, such as, but not limited to, corrosion, delamination, chipping, tears, uneven thickness 42, uneven sheen or gloss, and combinations thereof.

Figure 6:
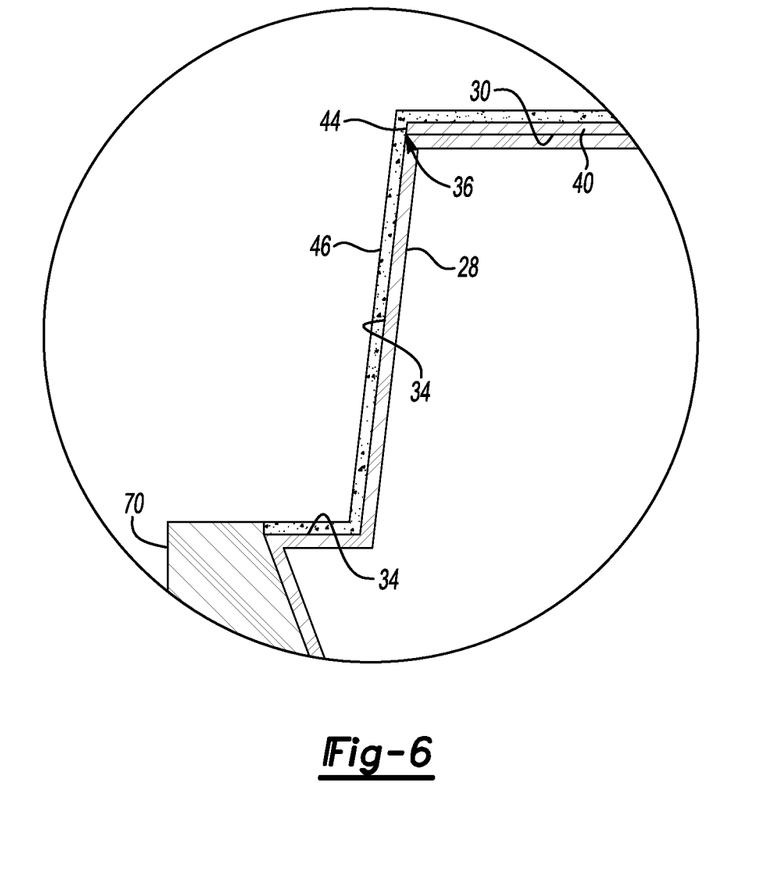
FIG. 6 is a schematic magnified cross-sectional illustration of the back coating of FIG. 5 taken at area 6.

As best shown in FIG. 2, the first coating 40 is not disposed on or along the fifth surface 34. Rather, the first coating 40 defines a distal edge surface 44 that is substantially flush with the fifth surface 34 at the edge 36. As such, as best shown in FIG. 6, the distal edge surface 44 may abut the fifth surface 34 at an intersection of the third surface 30 and the fifth surface 34, i.e., at the edge 36. Stated differently, the first coating 40 may be disposed solely along the third surface 30 so as not to wrap around the corner or edge 36 of the second element 28.

Referring again to FIG. 2, the emblem assembly 10 also includes a back coating 46 disposed on the first coating 40 and the fifth surface 34 to thereby wrap around the distal edge surface 44 so that the first coating 40 does not contact the chrome plating 26 disposed on the second surface 20. Therefore, when the second element 28 is attached to the first element 16, as set forth in more detail below, the back coating 46, rather than the distal edge surface 44 of the first coating 40, contacts the chrome plating 26 disposed on the second surface 20.

The back coating 46 may be a layer capable of imparting enhanced protection to the first coating 40 and the emblem assembly 10. For example, the back coating 46 may include ultraviolet protectants, corrosion inhibitors, sacrificial constituents, and combinations thereof. Further, the back coating 46 may be flexible upon curing and may withstand temperature variations. That is, the back coating 46 may be suitably flexible to expand and contract upon a change in ambient temperature without cracking and/or degrading. As such, the back coating 46 may be selected to degrade before the first coating 40 when subjected to identical operating environments, e.g., dirt, rain, snow, and/or cleaning agents.

The back coating 46 may be deposited on the first coating 40 via any suitable process. For example, the back coating 46 may be applied via dip-coating, spraying, rolling, electrostatic painting, and combinations thereof. The back coating 46 may have a thickness 48 (FIG. 2) of from about 0.05 µm to about 0.15 µm. The thickness 48 of the back coating 46 may not substantially vary along the first coating 40 disposed on the third surface 30, and the back coating 46 may be disposed along the entire first coating 40 and follow the contour of the first coating 40 along any grooves and/or voids (not shown) defined by the third surface 30.

Additionally, the back coating 46 may not be visible through the first coating 40 when viewed through the fourth surface 32 in the direction of arrow 24 (FIG. 2). That is, the first coating 40 formed from vacuum-metalized aluminum may not be transparent and/or translucent, and may therefore block the back coating 46 from view when viewed from the direction of arrow 24. However, the back coating 46 may have a dark hue or color, e.g., gray or black, to impart perceived depth or tone to the first coating 40. That is, the back coating 46 may function both as a primer and a protectant, i.e., to further protect the first coating 40 from degradation such as corrosion. The back coating 46 may minimize degradation of the first coating 40 over an operating life of the vehicle 12 (FIG. 1). For example, the first coating 40 may be substantially free from corrosion after continued exposure to cleaning solutions and vehicle operating environments. In particular, the back coating 46 may sufficiently seal the distal edge surface 44 to thereby minimize contact between fluids and/or contaminants and the first coating 40.

In one non-limiting example, the back coating 46 may be formed from a coating composition that includes a phenolic resin and a plurality of inert particles. For example, the coating composition may include a plurality of inert calcium carbonate particles. A non-limiting example of a suitable back coating 46 is commercially available from PPG Industries of Pittsburgh, Pa. under the trade name BC 2000-11.

Without intending to be limited by theory, the plurality of inert particles may form a physical barrier to electrical charge dissipation between the aluminum of the first coating 40 and the chrome plating 26 disposed on the second surface 20. That is, since the back coating 46 wraps around the distal edge surface 44 of the first coating 40 as set forth above, the back coating 46 may protect the first coating 40 from degradation initiated by bimetallic charge-activated corrosion, such as, but not limited to, galvanic corrosion and/or filiform corrosion. That is, the back coating 46 may minimize contact between the first coating 40 and the chrome plating 26 disposed on the second surface 20. Further, since the back coating 46 includes the plurality of inert particles, the back coating 46 may not only protect the first coating 40 via the phenolic resin, but alternatively or additionally, the plurality of inert particles may form a physical barrier to contaminants and/or solvents and thereby minimize any corrosive attack on the first coating 40.

For example, during operation of the vehicle 12 (FIG. 1), the emblem assembly 10 may be exposed to a solution (represented generally by symbol 50 in FIG. 2). The solution 50 may be formed from, for example, detergents, surfactants, cleaning agents, salt spray, solvents, environmental contaminants such as dirt, rain, snow, and combinations thereof, and the emblem assembly 10 may be coated with the solution 50 during operation and/or maintenance of the vehicle 12. As such, the emblem assembly 10 may further include the solution 50 disposed in contact with the back coating 46, the fourth surface 32, and the chrome plating 26. However, even when the solution 50 contacts the emblem assembly 10, the first coating 40 may be substantially free from degradation such as, but not limited to, pitting, delamination, tears, and the like. The back coating 46 may thereby act as an insulator from or barrier to environmental contaminants and/or fluids, and may protect the first coating 40.

Referring again to FIG. 2, the emblem assembly 10 may further include an adhesive 52 sandwiched between and disposed in contact with the back coating 46 and the chrome plating 26 disposed on the second surface 20 to thereby bond the second element 28 to the first element 16, wherein the adhesive 52 does not wrap around the edge 36. More specifically, the adhesive 52 may abut the chrome plating 26 disposed on the second surface 20 and extend along the second surface 20 to the edge 36. Stated differently, the adhesive 52 may not be disposed in contact with a portion (denoted generally at 54 in FIG. 2) of the back coating 46 that extends along the fifth surface 34. In this variation, therefore, the adhesive 52 may not be visible when viewed from a direction of arrow 24 in FIG. 2.

As set forth above, the adhesive 52 may adhere the second element 28 to the first element 16. More specifically, as best shown in FIG. 2, the adhesive 52 may adhere the second surface 20, e.g., the chrome plating 26 disposed on the second surface 20, to the back coating 46 so that the second element 28 is attached to the first element 16. The adhesive 52 may also be impermeable to environmental contaminants, e.g., dirt, rain, snow, and cleaning agents encountered during operation of the vehicle 12 (FIG. 1). Therefore, the adhesive 52 may sufficiently contact, e.g., uniformly contact, both of the back coating 46 and the chrome plating 26 disposed on the second surface 20 to seal off any potential entry routes for environmental contaminants and thereby protect the back coating 46.

The adhesive 52 may be selected from any material suitable for bonding the second element 28 to the first element 16. For example, the adhesive 52 may be a chemical composition, tape, or combination thereof. In one variation, the adhesive 52 may include a viscoelastic foam core and acrylic adhesive, and may be double-sided. That is, the acrylic adhesive may be disposed on two opposing surfaces of the viscoelastic foam core.

Figure 3:
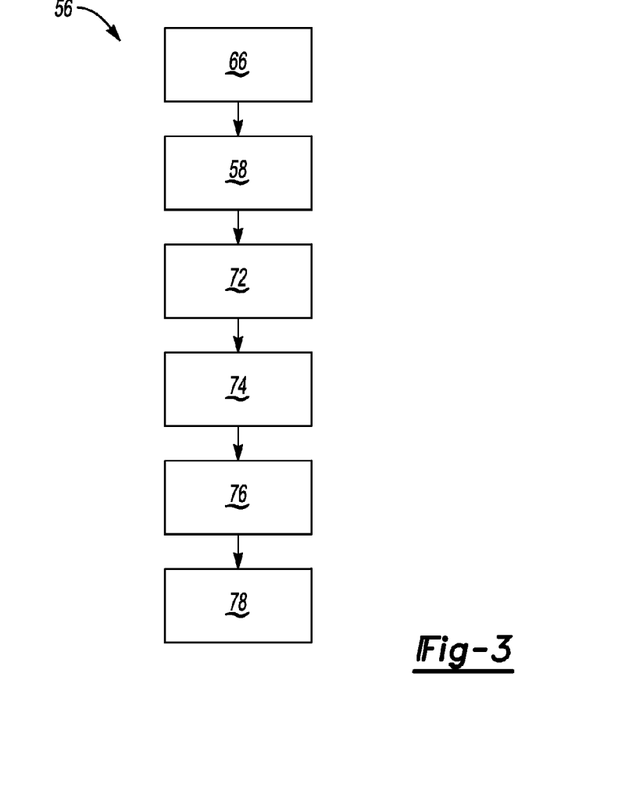
FIG. 3 is a schematic flowchart of a method of forming the emblem assembly of FIG. 1.

Referring now to FIG. 3, a method 56 of forming the emblem assembly 10 (FIG. 1) attachable to the vehicle 12 (FIG. 1) is disclosed. As described with reference to FIGS. 4A and 4B, the method 56 includes positioning 58 (FIG. 3) a mask 60 adjacent and in contact with the second element 28 so that the mask 60 covers only a selected portion 62 of the second element 28 and does not cover an exposed portion 64 of the second element 28. That is, the method 56 includes covering or masking the selected portion 62 of the second element 28. In particular, as best shown in FIG. 4A, the selected portion 62 may be the fifth surface 34, from the fourth surface 32 to the edge 36, and the exposed portion 64 may be the third surface 30.

The mask 60 (FIGS. 4A and 4B) may be formed from an elastomeric material, e.g., a semi-rigid elastic material, and positioning 58 (FIG. 3) may include abutting the fifth surface 34 against the elastomeric material so that the first coating 40 is not disposed on the fifth surface 34 during formation of the emblem assembly 10.

Figure 4A:
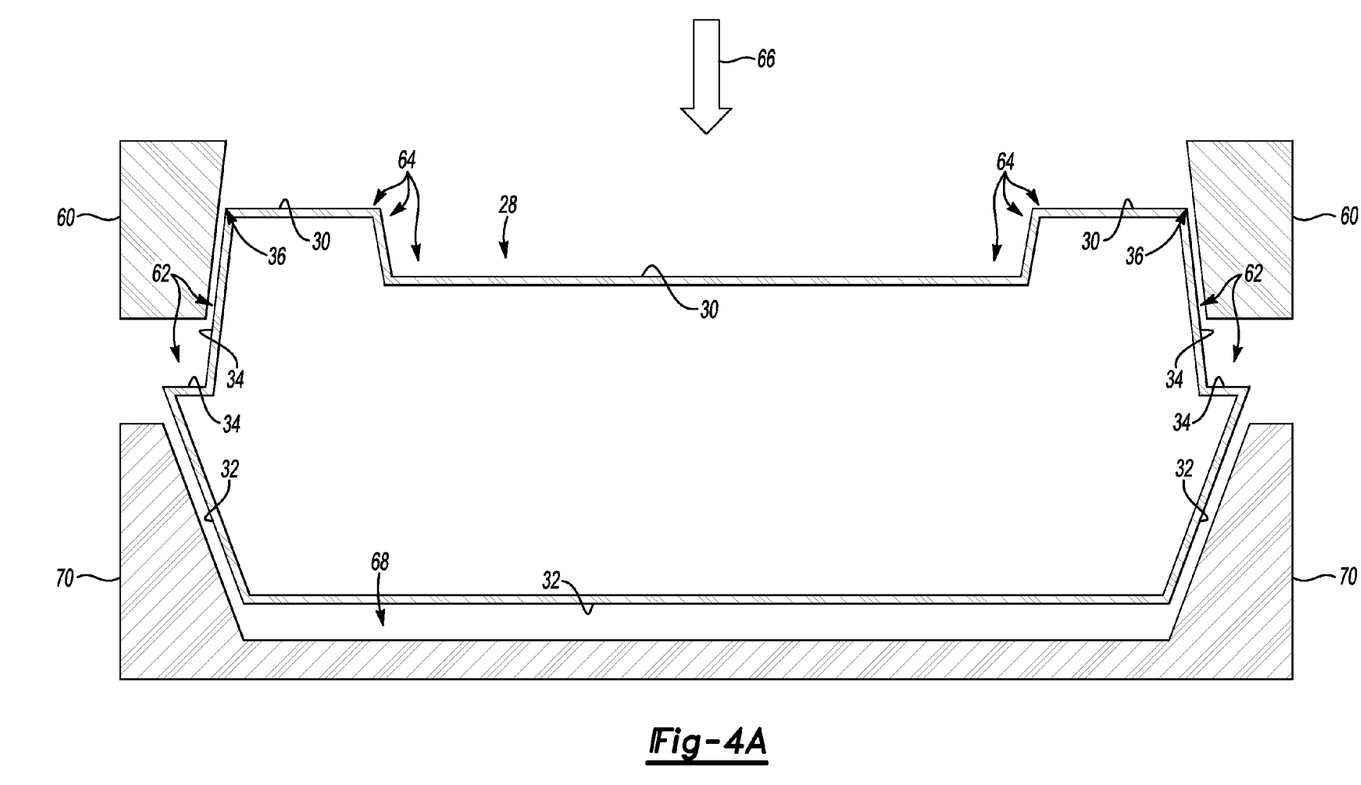
FIG. 4A is a schematic cross-sectional illustration of the second element of FIG. 1 taken along section lines 2-2, wherein the second element is disposed within a cavity in preparation for vacuum metalizing a first coating onto the second element.
Figure 4B:
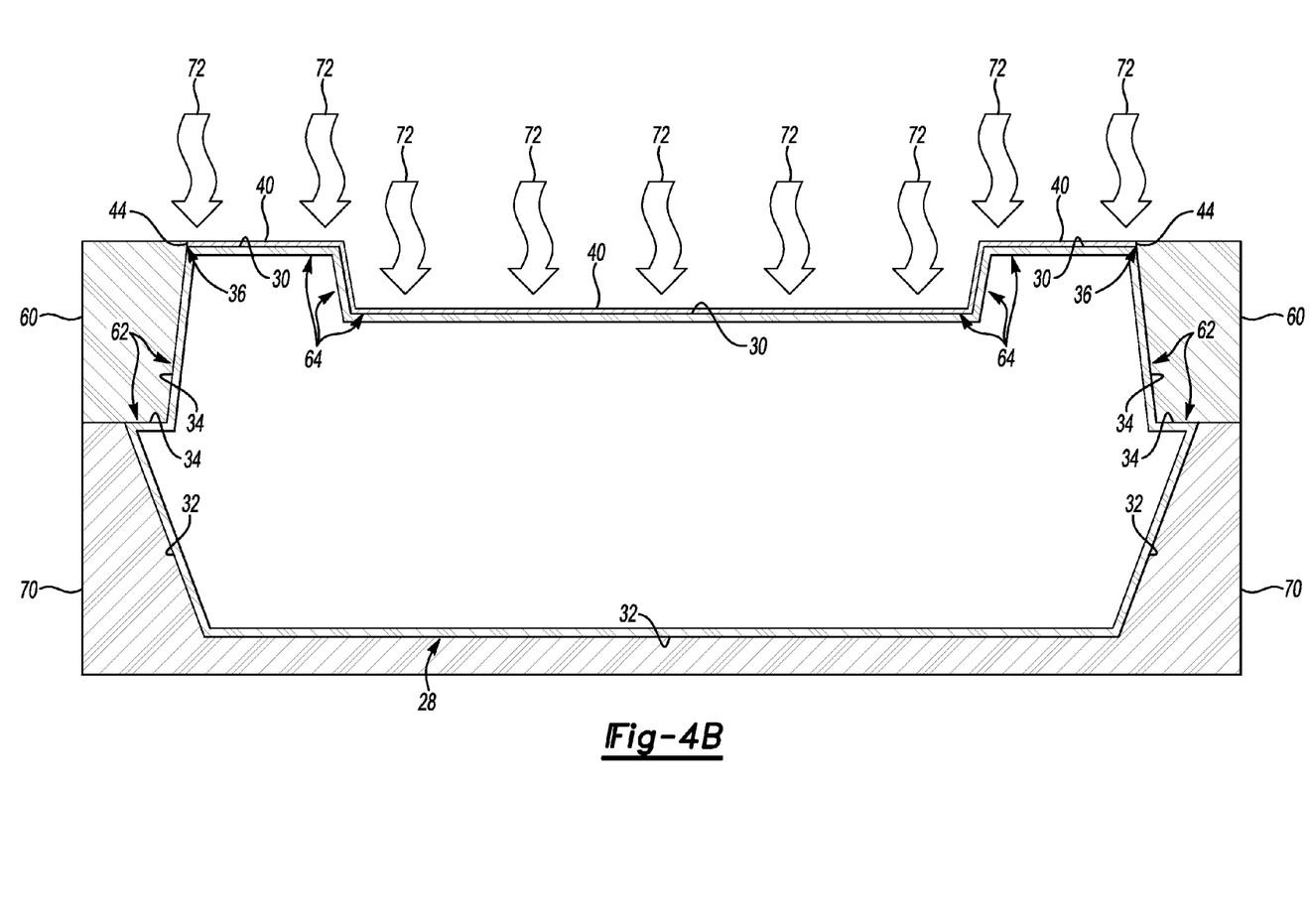
FIG. 4B is a schematic cross-sectional illustration of a first coating disposed on the second element of FIG. 4A, wherein the second element is disposed adjacent a mask, and the first coating has a distal edge surface abutting the mask.

More specifically, as best shown in FIGS. 4A and 4B, the method 56 (FIG. 3) may include disposing (represented generally by symbol 66 in FIG. 4A) the second element 28 within a cavity 68 defined by a fixture 70. The fixture 70 may be suitable for holding the second element 28 during a vacuum metalizing operation, and as such, may be a configured as a receptacle or mold. In one example, the fixture 70 may be referred to as a vacuum pack. Although shown as "top loaded" in FIG. 4A, it is to be appreciated that the second element 28 may be inserted into the cavity 68 from underneath or below the fixture 70, i.e., "bottom loaded". In this variation, the second element 28 may be held within the cavity 68 by, for example, an adhesive sheet. Therefore, after disposing 66, the method 56 includes positioning 58 the mask 60 adjacent and in contact with the second element 28 along the fifth surface 34 as set forth above.

With continued reference to FIG. 4B, the method 56 (FIG. 3) further includes vacuum metalizing (represented generally by arrows 72 in FIG. 4B) the first coating 40 onto only the exposed portion 64, wherein the first coating 40 has the distal edge surface 44 abutting the mask 60. That is, since the mask 60 covers the fifth surface 34 from the fourth surface 32 to the edge 36, the method 56 includes vacuum metalizing 72 the first coating 40 onto only the exposed portion 64, i.e., the third surface 30. As used herein, the terminology "vacuum metalizing" refers to depositing a thin layer of aluminum, i.e., the first coating 40, onto a component, e.g., the second element 28, via physical vapor deposition.

With continued reference to FIG. 4B, since the selected portion 62, i.e., the fifth surface 34 from the fourth surface 32 to the edge 36, contacts the mask 60 during vacuum metalizing 72, the first coating 40 may not wrap around the edge 36 and therefore has the distal edge surface 44, as best shown in FIG. 6. That is, the distal edge surface 44 of the first coating 40 abuts the mask 60. As such, the method 56 (FIG. 3) may include vacuum metalizing 72 the first coating 40 formed from aluminum onto the third surface 30, wherein the first coating 40 is not disposed on the fifth surface 34, and further wherein the first coating 40 has the distal edge surface 44 that is substantially flush with the fifth surface 34 at the edge 36.

Figure 5:
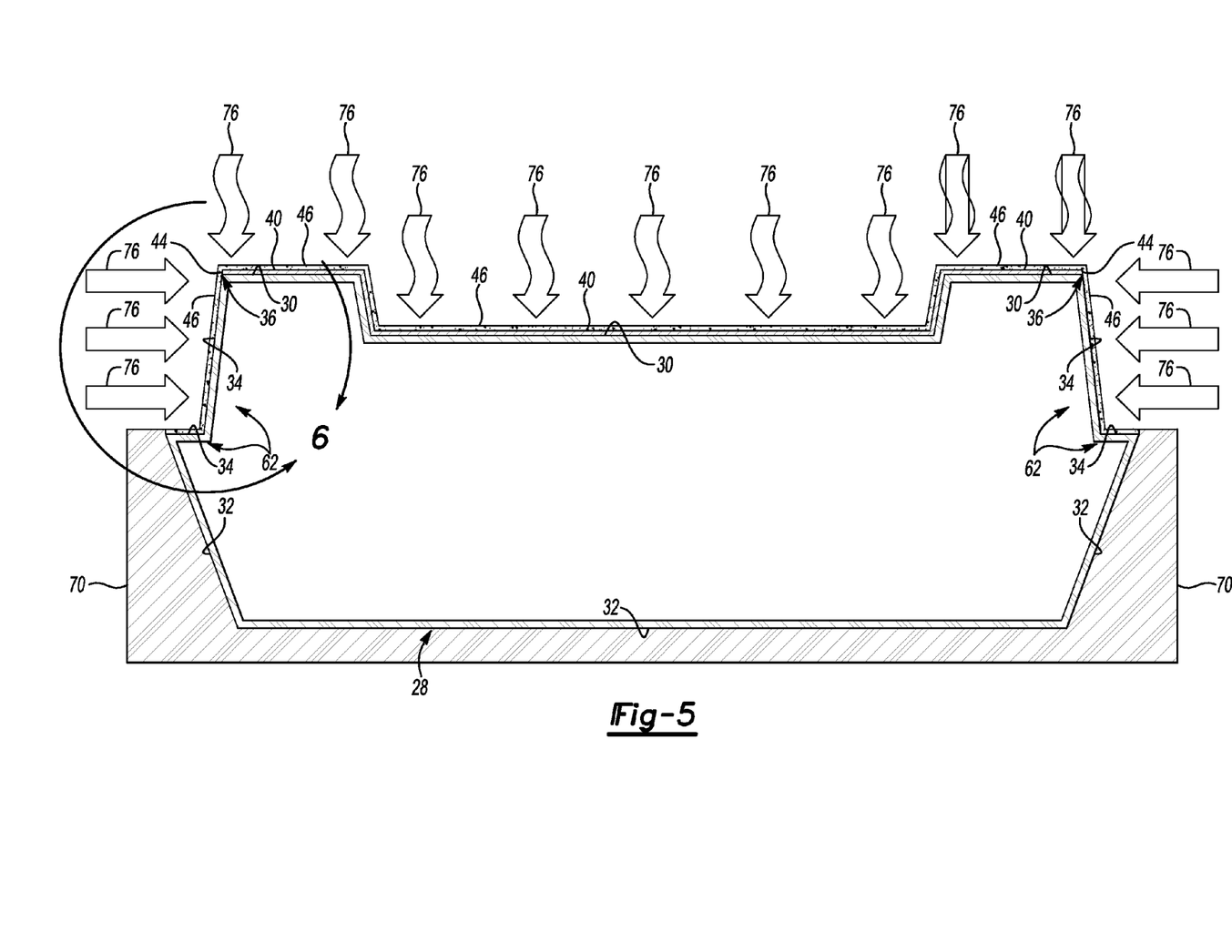
FIG. 5 is a schematic cross-sectional illustration of a back coating disposed on the first coating of FIG. 4B, wherein the back coating wraps around the distal edge surface.

Referring now to FIG. 5, after vacuum metalizing 72 (FIG. 4B), the method 56 (FIG. 3) may further include removing 74 (FIG. 3) the mask 60 (FIG. 4B) from the second element 28 to uncover the selected portion 62. That is, the method 56 may include removing 74 the mask 60 to uncover or expose the fifth surface 34 from the fourth surface 32 to the edge 36. For example, as shown in FIG. 5, the second element 28 may remain disposed within the cavity 68 of the fixture 70, and the mask 60 may be removed from the second element 28 to uncover the selected portion 62.

With continued reference to FIG. 5, the method 56 (FIG. 3) also includes depositing (represented generally by arrows 76 in FIG. 5) the back coating 46 onto only the first coating 40 and the selected portion 62 to thereby wrap the back coating 46 around the distal edge surface 44. Stated differently, the method 56 includes depositing 76 the back coating 46 onto only the first coating 40 and the fifth surface 34 to thereby wrap the back coating 46 around the distal edge surface 44.

Therefore, the depositing 76 may include encapsulating the first coating 40 between the second element 28 and the back coating 46, and overlapping the distal edge surface 44 with the back coating 46. As such, depositing 76 may include covering the distal edge surface 44 with the back coating 46 at the edge 36.

The back coating 46 may be deposited onto the second element 28, i.e., onto only the first coating 40 and the selected portion 62, in any suitable manner. For example, the back coating 46 may be deposited via dip-coating, spraying, rolling, electrostatic painting, and combinations thereof.

Referring again to FIG. 2, after depositing 76 (FIG. 3), the method 56 (FIG. 3) includes inserting 78 (FIG. 3) the second element 28 into the first element 16 so that the first coating 40 does not contact the first element 16 to thereby form the emblem assembly 10. More specifically, the method 56 may include inserting 78 the second element 28 into the first element 16 so that the first coating 40 does not contact the chrome plating 26 disposed on the second surface 20. That is, inserting 78 may include contacting the back coating 46 and the first element 16, e.g., the chrome plating 26, rather than contacting the first coating 40 and the first element 16.

More specifically, inserting 78 (FIG. 3) may include insulating, e.g., electrically and/or chemically insulating, the first coating 40 from the first element 16 at the distal edge surface 44 to thereby minimize degradation of the first coating 40. That is, the back coating 46 may protect the first coating 40 from degradation and/or corrosion caused by chemicals and/or charge dissipation between two metals, e.g., the aluminum of the first coating 40 and the chrome of the chrome plating 26 disposed on the second surface 20. Therefore, inserting 78 may further include insulating the first coating 40 from the chrome plating 26 disposed on the second surface 20 by wrapping the back coating 46 around the distal edge surface 44. As set forth above, the back coating 46 may provide an insulation barrier to electrical charge dissipation between the first coating 40 and the chrome plating 26 disposed on the second surface 20. Since such electrical charge dissipation may degrade the first coating 40, the back coating 46 wrapped around the distal edge surface 44 of the first coating 40 at the edge 36 minimizes such degradation.

With continued reference to FIG. 2, inserting 78 (FIG. 3) may include attaching together the first element 16 and the second element 28 so that the first coating 40 does not contact the chrome plating 26 disposed on the second surface 20. That is, inserting 78 may include protecting the distal edge surface 44 of the first coating 40 from bimetallic charge dissipation, e.g., the exchange of electrical current between the first coating 40 and the chrome plating 26, that contributes to degradation of one or more of the components. Therefore, as shown in FIG. 2, the method 56 (FIG. 3) may further include, after depositing 76 (FIG. 3), adhering the adhesive 52 to the back coating 46 so that the adhesive 52 does not wrap around the edge 36 and does not contact the fifth surface 34. For example, inserting 78 may include sandwiching the adhesive 52 between the second surface 20 and the second element 28 to thereby attach the second surface 20 to the second element 28. Upon such assembling, only the back coating 46 may be disposed between the fifth surface 34 and the chrome plating 26 disposed on the second surface 20, as best shown in FIG. 2.

In addition, after inserting 78 (FIG. 3) the second element 28 into the first element 16 as set forth above, the method 56 (FIG. 3) may include any suitable post-forming operation, such as, but not limited to, removing the emblem assembly 10 from the cavity 68 (FIG. 4A), trimming the emblem assembly 10, cleaning the emblem assembly 10, packaging the emblem assembly 10, and the like.

The disclosed method 56 (FIG. 3) forms emblem assemblies 10 (FIG. 1) having excellent appearance and quality. In particular, the method 56 forms emblem assemblies 10 exhibiting minimal degradation of the first coating 40 (FIG. 2) after the first coating 40 is exposed to the solution 50 (FIG. 2). Further, the method 56 forms emblem assemblies 10 having minimized corrosion and/or degradation from, for example, filiform corrosion, galvanic corrosion, and/or bimetallic charge dissipation. In particular, the back coating 46 (FIG. 2) that contacts and covers the distal edge surface 44 (FIG. 2) minimizes contact between the first coating 40 and the chrome plating 26 (FIG. 2) disposed on the second surface 20 (FIG. 2). More specifically, the first coating 40 that covers and wraps around the distal edge surface 44 at the edge 36 (FIG. 2) minimizes contact between the emblem assembly 10 and contaminants such as dirt, chemicals, and fluids that may contribute to corrosion and/or degradation of the emblem assembly 10. That is, the back coating 46 may insulate and protect the distal edge surface 44 from contaminants. Therefore, inserting 78 (FIG. 3) the second element 28 into the first element 16 minimizes fluid and/or contaminant contact with each of the first coating 40 and the fifth surface 34. Further, the method 56 economically produces emblem assemblies 10 within desired production cycle times, and provides emblem assemblies 10 having excellent durability that are suitable for attachment to the exterior surface 14 (FIG. 1) of the vehicle 12 (FIG. 1). As such, the method 56 allows for economical and efficient formation of the emblem assemblies 10, and the emblem assemblies 10 contribute to an increased perceived quality of the vehicle 12.

While the best modes for carrying out the disclosure have been described in detail, those familiar with the art to which this disclosure relates will recognize various alternative designs and embodiments for practicing the disclosure within the scope of the appended claims.

The invention claimed is:

1. A method of forming an emblem assembly configured for attachment to a vehicle, the method comprising:
positioning a mask adjacent and in contact with a second element so that the mask covers only a selected portion of the second element and does not cover an exposed portion of the second element;
vacuum metalizing a first coating onto only the exposed portion, wherein the first coating has a distal edge surface abutting the mask;
after vacuum metalizing, removing the mask from the second element to uncover the selected portion;
depositing a back coating onto only the first coating and the selected portion to thereby wrap the back coating around the distal edge surface;
wherein the back coating has a thickness of from about 0.05 μm to about 0.15 μm; and
after depositing, inserting the second element into a first element configured for attachment to the vehicle so that the first coating does not contact the first element to thereby form the emblem assembly.

2. The method of claim 1, wherein depositing includes encapsulating the first coating between the second element and the back coating.

3. The method of claim 2, wherein inserting includes electrically insulating the first coating from the first element at the distal edge surface to thereby minimize degradation of the first coating.

4. The method of claim 1, wherein depositing includes overlapping the distal edge surface with the back coating.

5. The method of claim 1, wherein inserting includes contacting the back coating and the first element.

6. A method of forming an emblem assembly configured for attachment to a vehicle, the method comprising:
disposing a second element within a cavity defined by a fixture, wherein the second element has:
a third surface;
a fourth surface spaced apart from the third surface; and
a fifth surface interconnecting the third surface and the fourth surface, wherein the fifth surface abuts the third surface to form an edge;
after disposing, positioning a mask adjacent and in contact with the second element along the fifth surface so that the mask covers only a selected portion of the second element and does not cover an exposed portion of the second element;
wherein the fifth surface from the fourth surface to the edge is the selected portion, and wherein the third surface is the exposed portion;
vacuum metalizing a first coating formed from aluminum onto the third surface, wherein the first coating is not disposed on the fifth surface, and further wherein the first coating has a distal edge surface that is substantially flush with the fifth surface at the edge;
after vacuum metalizing, removing the mask from the fifth surface to uncover the selected portion;
after removing, depositing a back coating onto the first coating and the fifth surface to thereby wrap the back coating around the distal edge surface;
wherein the back coating has a thickness of from about 0.05 μm to about 0.15 μm; and
after depositing, inserting the second element into a first element configured for attachment to the vehicle to thereby form the emblem assembly;
wherein the first element has a first surface and a second surface recessed from the first surface, and includes a chrome plating disposed on the first surface and the second surface;
wherein the first coating does not contact the chrome plating disposed on the second surface.

7. The method of claim 6, wherein inserting includes attaching together the first element and the second element so that the first coating does not contact the chrome plating disposed on the second surface.

8. The method of claim 6, further including, after depositing, adhering an adhesive to the back coating so that the adhesive does not wrap around the edge and does not contact the fifth surface.

9. The method of claim 8, wherein inserting includes sandwiching the adhesive between the second surface and the second element to thereby attach the second surface to the second element.

10. The method of claim 6, wherein depositing includes covering the distal edge surface with the back coating at the edge.

11. The method of claim 10, wherein inserting further includes insulating the first coating from the chrome plating disposed on the second surface by wrapping the back coating around the distal edge surface.

12. The method of claim 6, wherein the mask is formed from an elastomeric material, and further wherein positioning includes abutting the fifth surface against the elastomeric material so that the first coating is not disposed on the fifth surface.

* * * * *